United States Patent
Wakano et al.

(10) Patent No.: US 7,763,888 B2
(45) Date of Patent: Jul. 27, 2010

(54) SOLID STATE IMAGE PICKUP DEVICE AND METHOD FOR MANUFACTURING THE SAME

(75) Inventors: Toshifumi Wakano, Kanagawa (JP); Keiji Mabuchi, Kanagawa (JP); Takashi Nakashikiryo, Kagoshima (JP); Kazunari Matsubayashi, Kumamoto (JP)

(73) Assignee: Sony Corporation, Tokyo (JP)

( * ) Notice: Subject to any disclaimer, the term of this patent is extended or adjusted under 35 U.S.C. 154(b) by 560 days.

(21) Appl. No.: 11/208,959

(22) Filed: Aug. 22, 2005

(65) Prior Publication Data
US 2006/0060854 A1    Mar. 23, 2006

(30) Foreign Application Priority Data
Aug. 31, 2004 (JP) .............................. P2004-252262

(51) Int. Cl.
H01L 29/04 (2006.01)
(52) U.S. Cl. ................... 257/59; 257/222; 257/292; 257/448; 257/459
(58) Field of Classification Search .............. 257/59, 257/292, 222, 459, 448
See application file for complete search history.

(56) References Cited

U.S. PATENT DOCUMENTS 6,639,261 B2* 10/2003 Rhodes .................. 257/291
2004/0089883 A1* 5/2004 Kim ....................... 257/222
2005/0023580 A1* 2/2005 Rhodes .................. 257/292
2005/0161713 A1* 7/2005 Rhodes .................. 257/292

FOREIGN PATENT DOCUMENTS

| JP | 53-122316 | 10/1978 |
| JP | 08-064796 | 3/1996 |
| JP | 2001-230400 | 8/2001 |
| JP | 2002-164565 | 6/2002 |

OTHER PUBLICATIONS

Japanese Patent Office Action corresponding to Japanese Serial No. 2004-252262 dated Jul. 22, 2009.

* cited by examiner

Primary Examiner—Long Pham
(74) Attorney, Agent, or Firm—Sonnenschein Nath & Rosenthal LLP

(57) ABSTRACT

To reduce white spots by optimizing an impurity concentration of a p-type impurity doped region of a well contact, a size of a contact portion, a position of an n-type region serving as a photoelectric converter, and so on.

In a solid state image pickup device in which a semiconductor substrate 11 includes a pixel region where a plurality of pixels are arranged, each pixel including a photoelectric converter 21, and a pixel well 12 shared by the respective pixels, a well contact 14 supplying a reference voltage to the pixel well 12 includes: an electrode 15 supplying a reference voltage; a p-type impurity doped region 16 placed in a surface of the pixel well 12; and a contact portion 17 placed in the p-type impurity doped region 16 so as to be connected to the electrode 15 and having a higher concentration than the p-type impurity doped region 16. The p-type impurity doped region 16 is doped with at least a p-type impurity, with an impurity concentration of $1 \times 10^{19}$ cm$^{-3}$ or less.

12 Claims, 14 Drawing Sheets

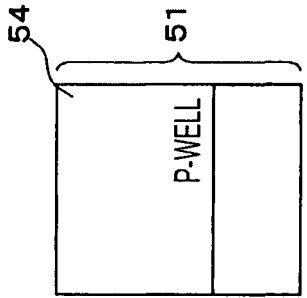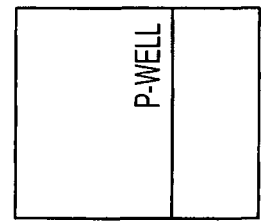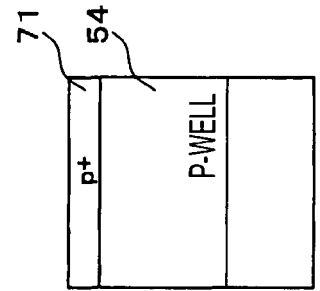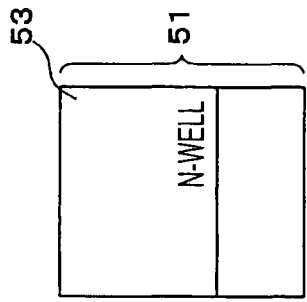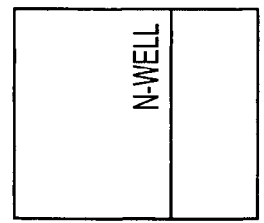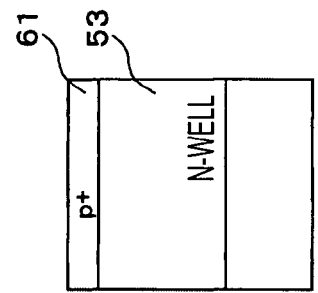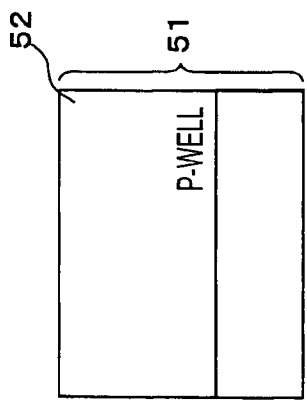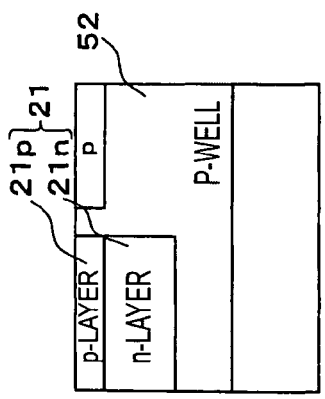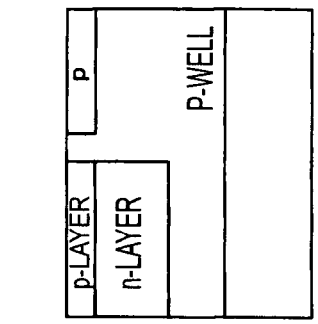
FIG. 9A  FIG. 9B  FIG. 9C

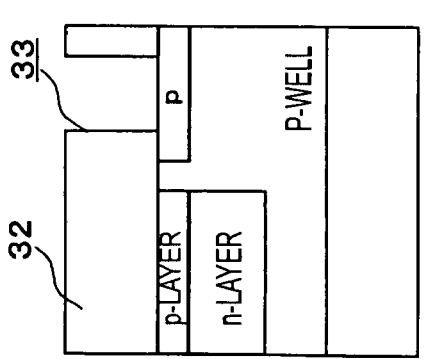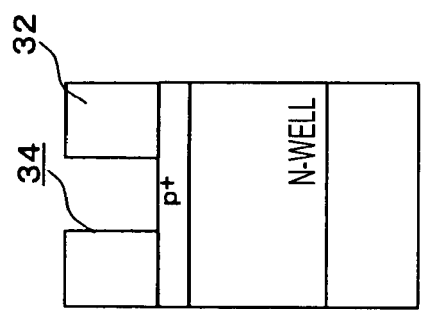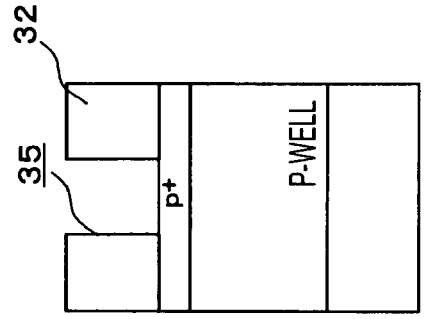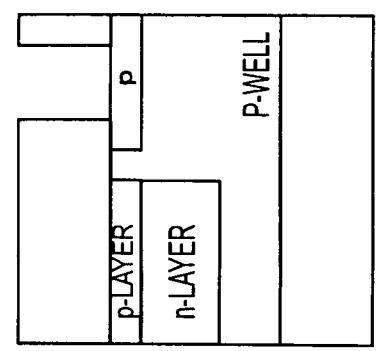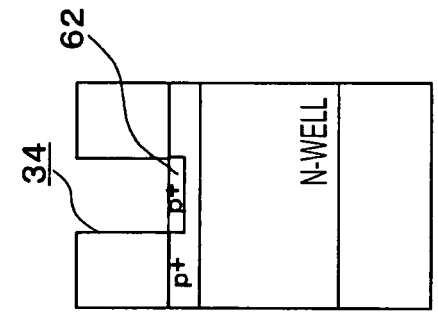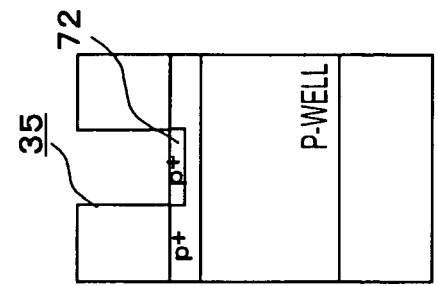
FIG. 11A  FIG. 11B

SOLID STATE IMAGE PICKUP DEVICE AND METHOD FOR MANUFACTURING THE SAME

CROSS PREFERENCE TO RELATED APPLICATIONS

The present invention claims the benefit of Japanese Patent Application JP 2004-252262 filed in the Japanese Patent Office on Aug. 31, 2004, the entire contents of which are incorporated herein by reference.

FIELD OF THE INVENTION

The present invention relates to a solid state image pickup device and a method for manufacturing the same for easily reducing defects white spots in the dark.

BACKGROUND OF THE INVENTION

In a solid state image pickup device, particularly in a CMOS (complementary metal oxide semiconductor) sensor, when many pixels are arranged in an array pattern (hereinafter, a region where many pixels are arranged in an array pattern is called a "pixel region") and when a well potential of a common p-well is applied thereto from immediately outside a periphery of the pixel region, that is, from immediately outside a most external pixel, a time constant is different in a peripheral portion of the pixel region near the p-well contact and in a central portion of the pixel region far from the p-well contact. For example, if a drain voltage changes while power is being supplied by a whole-surface drain wiring, coupling between the whole-surface drain wiring and the p-well occurs, which leads to a change in a well potential of the p-well. As a result, the well potential changes over a long time period in the central portion of the pixel region, where a time constant is large, compared to the peripheral portion of the pixel region. Thus, a reference voltage momentarily differs in the central portion and the peripheral portion of the pixel region, which causes different outputs in the central portion and the peripheral portion of the pixel region. Accordingly, a phenomenon called shading may occur.

In order to prevent shading, a well contact may be provided in each pixel to stabilize a well potential. By providing a well contact in each pixel, a well potential can be stabilized even when a voltage of a drain terminal changes, the same reference voltage can be obtained in both the central portion and the peripheral portion of the pixel region, and shading can be prevented.

Hitherto, the well contact is formed by a typical CMOS process. Specifically, after forming a p-well which is common to all pixels, a $p^+$-region having a higher p-type impurity concentration than the p-well is formed, an interlayer film is formed, etching is performed to form a hole in the interlayer film on the $p^+$-region, a high-concentration contact ion implantation is performed on the hole, and then the hole is filled with an electrode. The $p^+$-region is formed by using an ion implantation step for forming a source/drain of a P-channel transistor of a peripheral circuit region outside the pixel region (hereinafter referred to as a peripheral region), so that the $p^+$-region has a high concentration of about $1\times10^{20}$ cm$^{-3}$ or more. In a recently-adopted CMOS process, a boron/fluorine compound, particularly $BF_2$ (boron difluoride) is used as an ionic species in the ion implantation and contact ion implantation in order to satisfy a demand for a shallow junction.

As shown in FIG. 13, in a unit pixel, a photodiode 121 performing photoelectric conversion and a transfer transistor 131 transferring a photoelectric-converted signal charge are placed in an active region 113 in a p-well 112. Further, a well contact 114 is placed in the active region 113 in the p-well 112. Other transistors placed in the pixel are not shown in the figure. The well contact 114 may be placed in the active region 113 together with the photodiode, but in any case, the well contact 114 is placed on the p-well.

As described above, in order to provide a well contact in a pixel, a large amount of impurity such as B or $BF_2$ need be introduced into a portion close to a photodiode or an active region, where the photodiode is placed, by using an ion implantation technique or the like. However, such high-concentration ion implantation often causes implantation damage (e.g., crystal defect) or mixing of impurity atoms, such as an undesired heavy metal. Since the crystal defect and heavy metal atoms may cause a dark current, the dark current occurs by providing a well contact in a pixel. If a large amount of dark current occurs in a pixel, that is observed as white spots in the dark (hereinafter referred to as white spots) on a captured image.

If a high-concentration p-type doped region is adjacent to the photodiode, a dark current occurs due to an intense electric field between the p-type doped region and an n-type layer of the photodiode, which may be a cause of white spots. These white spots result in degradation in an image quality, which arises a problem.

A problem to be solved is that, when a large amount of impurity need be introduced by an ion implantation technique or the like in order to provide a contact in a pixel, a dark current occurs due to an incidental crystal defect and mixing of an undesired impurity, which causes white spots.

SUMMARY OF THE INVENTION

In a solid state image pickup device of the present invention, a semiconductor substrate includes a pixel region where a plurality of pixels are arranged, each pixel including a signal charge accumulating portion and a transistor, and a peripheral circuit region outside the pixel region; the pixel region includes a pixel well of a first conductive type and a pixel well contact supplying a reference voltage to the pixel well; and the peripheral circuit region includes a first peripheral well of a second conductive type and a MIS transistor of the first conductive type placed in a region of the first peripheral well. The pixel well contact includes: an electrode supplying a reference voltage; a first impurity doped region of the first conductive type placed in a surface of the pixel well; and a contact portion of the first conductive type placed in the first impurity doped region so as to be connected to the electrode and having a higher concentration than the first impurity doped region. An impurity concentration of the first impurity doped region is lower than that of a source/drain of the MIS transistor.

In a solid state image pickup device of the present invention, a semiconductor substrate includes a pixel region where a plurality of pixels are arranged, each pixel including a signal charge accumulating portion and a transistor, and a pixel well of a first conductive type shared by the respective pixels. The pixel region is provided with a pixel well contact supplying a reference voltage to the pixel well. The pixel well contact includes: an electrode supplying a reference voltage; a first impurity doped region of the first conductive type placed in a surface of the pixel well; and a contact portion of the first conductive type placed in the first impurity doped region so as to be connected to the electrode and having a higher concentration than the first impurity doped region. The first impurity doped region is doped with at least an impurity of the first conductive type and the impurity concentration thereof is $1 \times 10^{19}$ cm$^{-3}$ or less.

In a solid state image pickup device manufactured by a method of the present invention, a semiconductor substrate includes a pixel region where a plurality of pixels are arranged, each pixel including a signal charge accumulating portion and a transistor, and a pixel well of a first conductive type shared by the respective pixels. The method includes: a first step of forming a first impurity doped region by ion-implanting an impurity of the first conductive type to a surface of the semiconductor substrate together with the pixel well at a surface density of $1 \times 10^{14}$ cm$^{-2}$ or less in total; a second step of forming an interlayer film after the first step; a third step of forming a hole for providing a contact electrode in the interlayer film on the first impurity doped region; a fourth step of forming a contact portion by ion-implanting an impurity of the first conductive type through the hole; and a fifth step of forming the contact electrode by filling the hole.

In a solid state image pickup device manufactured by a method of the present invention, a semiconductor substrate includes a pixel region where a plurality of pixels are arranged, each pixel including a signal charge accumulating portion and a transistor, and a p-type pixel well shared by the respective pixels. The method includes: a first step of forming the pixel well; a second step of forming an interlayer film; a third step of forming a hole for providing a contact electrode in the interlayer film at a position for a contact of the pixel well; a fourth step of forming a contact portion by ion-implanting boron through the hole; and a fifth step of forming the contact electrode by filling the hole.

BRIEF DESCRIPTION OF THE DRAWINGS

FIGS. 9A to 9C are cross sectional views of schematic configurations showing a method for manufacturing a solid state image pickup device according to an embodiment of the present invention.

FIGS. 11A and 11B are cross sectional views of schematic configurations showing the method for manufacturing the solid state image pickup device according to the embodiment of the present invention.

DESCRIPTION OF THE PREFERRED EMBODIMENTS

When forming a pixel well contact in a pixel region in order to stabilize a well potential, white spots occur by a side effect while causing degradation in an image quality. The white spots can be reduced without adding a new component, by setting an impurity concentration of a first impurity doped region of a first conductive type of a pixel well contact to $1 \times 10^{19}$ cm$^{-3}$ or less, by isolating a contact portion from a photoelectric converter as an n-type region, by performing ion implantation for forming a source/drain of a MIS (metal insulator semiconductor) transistor of the first conductive type of a peripheral circuit by masking the pixel well contact, by using boron (not BF$_2$) as a high-concentration impurity for the contact portion, and so on.

Figure 1:
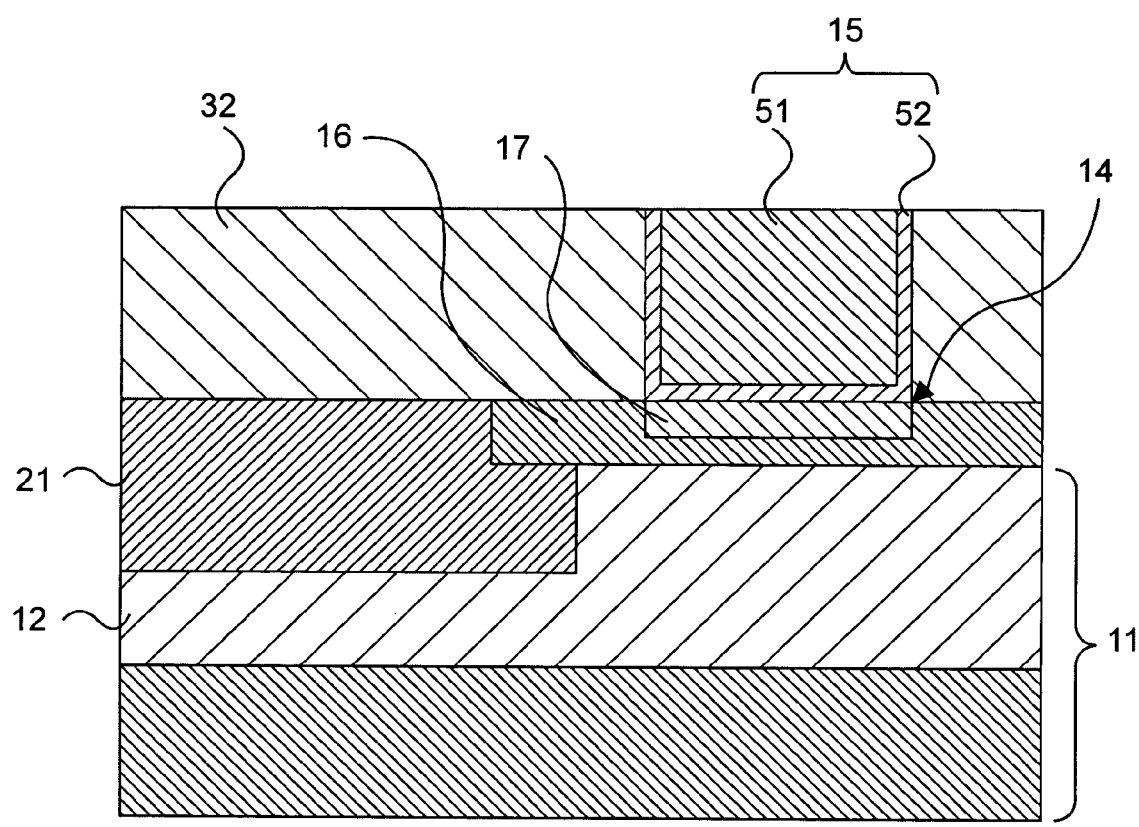
FIG. 1 is a cross sectional view of a schematic configuration showing a solid state image pickup device and a method for manufacturing the same according to a first embodiment of the present invention.
Figure 2A:
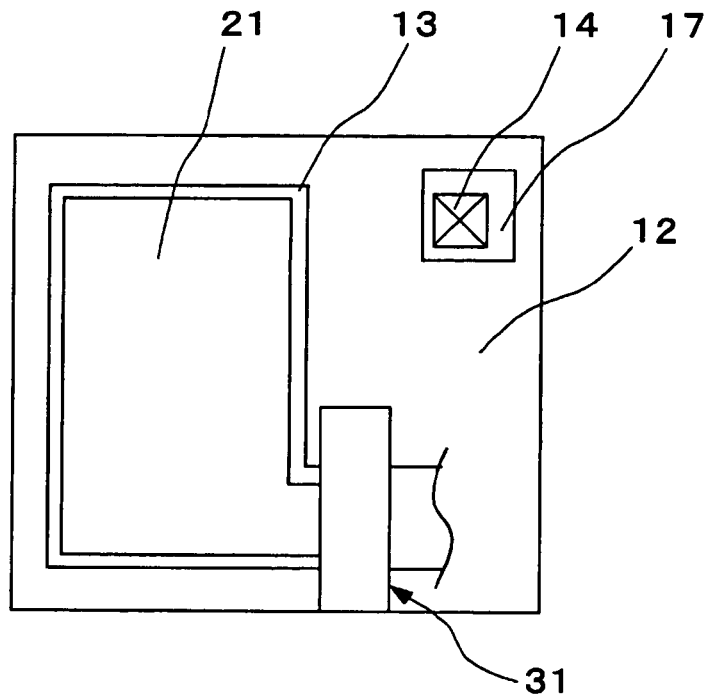
FIGS. 2A and 2B are plane layout views showing the solid state image pickup device and the method for manufacturing the same according to the first embodiment of the present invention.
Figure 2B:
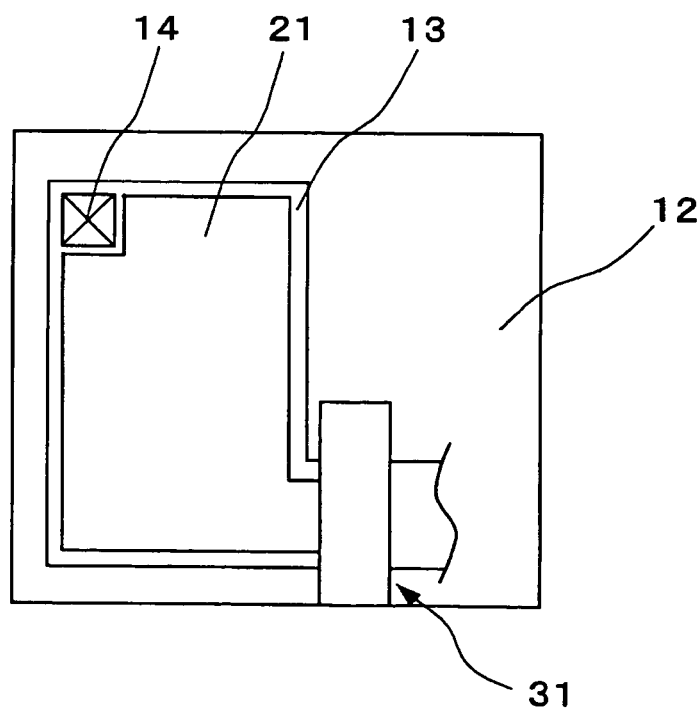

Hereinafter, a solid state image pickup device and a method for manufacturing the same according to a first embodiment of the present invention will be described with reference to FIG. 1, which is a cross-sectional view showing a schematic configuration, and FIGS. 2A and 2B, which show plane layouts. In FIGS. 1, 2A, and 2B, a main portion of one pixel according to the invention is shown. In the following description, a first conductive type is a p-type and a second conductive type is an n-type.

As shown in FIGS. 1, 2A, and 2B, a semiconductor substrate 11 includes a pixel region provided with a plurality of pixels, each pixel including a photoelectric converter 21 and a transfer transistor 31 (not shown in FIG. 1); and a pixel well 12 shared by the respective pixels. The photoelectric converter 21 includes a photodiode or the like and the transfer transistor 31 includes an n-channel MOS transistor or the like. The photoelectric converter 21 is an n-type region, is used for conducting photoelectric conversion, and serves as a signal charge accumulating portion. Herein, the signal charge accumulating portion is not a region where a signal charge is constantly accumulated but is a region where electrons or positive holes entered there are accumulated as a signal charge in a close region. That is, if a charge generated from a dark current or the like, which is not a desired signal, enters the signal charge accumulating portion, the charge is detected as noise.

The pixel well 12 is provided with a well contact 14 supplying a reference voltage for stabilizing a well potential. The well contact 14 includes an electrode 15 placed in an interlayer film 32 and supplying a reference voltage; a p-type impurity doped region 16 placed in a surface of the pixel well 12; and a contact portion 17 placed in the p-type impurity doped region 16, connected to the electrode 15, and having a higher concentration than the p-type impurity doped region 16. The p-type impurity doped region 16 is doped with at least a p-type impurity such that an impurity concentration is $1 \times 10^{19}$ cm$^{-3}$ or less. The electrode 15 includes a tungsten plug 51 or the like, with a barrier metal layer 52 of a three-layer film: titanium; titanium nitride; and titanium being placed on side surfaces thereof. Further, an upper portion of the electrode 15 connects to a wiring for the well contact (not shown).

Herein, the p-type impurity doped region 16 is a p-type region extending under the electrode 15 and its vicinity and having a depth of about 0.1 μm from a silicon surface. In a manufacturing process, the p-type impurity doped region 16 is formed before forming a contact hole as a hole for the electrode 15. The p-type impurity doped region 16 is placed under the electrode 15 and its vicinity while extending over at least an allowance for misalignment (about 0.05 μm). Typically, the p-type impurity doped region 16 extends to an element isolation region (not shown) on a side where the photoelectric converter 21 does not exist. The p-type impurity doped region 16 is made of a sum of an impurity component near a surface of the pixel well 12 and an impurity component added thereto by ion implantation.

The contact portion 17 is formed by ion implantation after forming a contact hole for the electrode 15 and before filling the contact hole to form the electrode 15, as in a typical CMOS process. Therefore, the contact portion 17 has a diameter almost the same as that of the electrode 15 and is placed within the p-type impurity doped region 16. The depth of the contact portion 17 may either be deeper or shallower than the p-type impurity doped region 16.

As shown in FIG. 2A, the well contact 14 may be isolated from the photoelectric converter 21. Alternatively, as shown in FIG. 2B, the well contact 14 may be placed in an active region 13 where the photoelectric converter 21 and the transfer transistor 31 are placed. By placing the well contact 14 in the active region 13, the pixel region can be reduced, so that a highly-integrated solid state image pickup device can be obtained. FIG. 1 shows the latter case.

In order to form the p-type impurity doped region 16 (see FIG. 1) having an impurity concentration of $1 \times 10^{19}$ cm$^{-3}$ or less, ion implantation is performed on the pixel well 12 by using a boron/fluorine compound, such as BF$_2$ (boron difluoride), as an ionic species while setting a dose to $1 \times 10^{14}$ cm$^{-2}$ or less. Further, this portion is masked in a step of ion implantation for a source/drain of a p-type MOS transistor. With this method, the p-type impurity doped region 16 can be formed to have a lower concentration than the source/drain of the p-type MOS transistor, unlike in a conventional method: the p-type impurity doped region 16 is formed by the ion implantation for the source/drain of the p-type MOS transistor, which results in the same concentration in both of them. Accordingly, an ohmic contact can be achieved by the contact portion 17, although a contact resistance becomes slightly high. Since contacts are densely aligned at pixel pitches or several-fold pitches thereof at the pixel region, no problem occurs in a typical product. The configuration of the well contact may be designed in accordance with a pixel in a peripheral circuit other than the pixel region, but in that case, a designing environment for the peripheral circuit must be changed and a characteristic and reliability thereof must be reconsidered. In many cases, pixels are optimized to make the most of their characteristic, but a configuration of a peripheral logic circuit should not be changed. Therefore, the well contact of the peripheral circuit is manufactured by the conventional method so as to discriminate it from the well contact in the pixel region. The other components (the pixel well 12, the photoelectric converter 21, the transfer transistor 31, and so on) are manufactured by a conventional method.

Next, impurity concentration distributions in a depth direction of the p-type impurity doped region 16 and the contact portion 17 are described with reference to FIG. 3.

Figure 3:
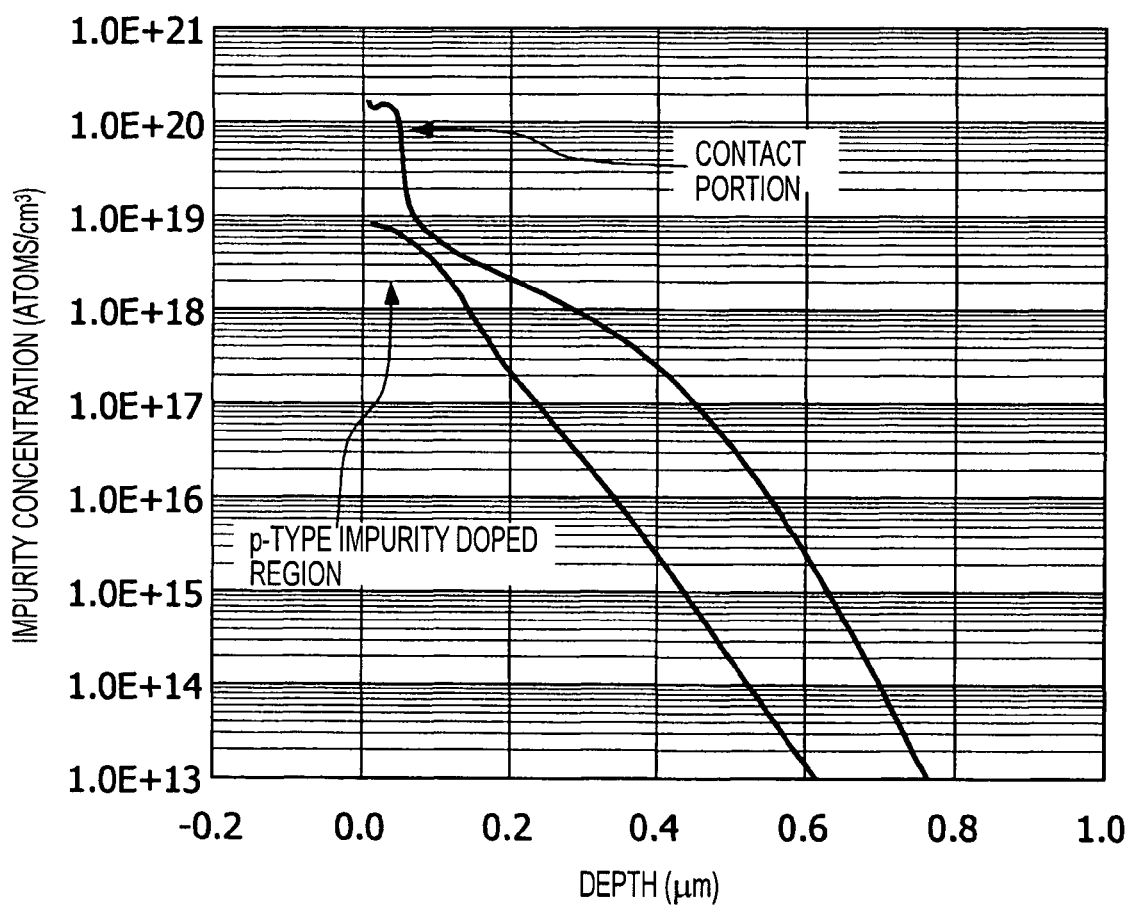
FIG. 3 shows impurity concentration distributions in a depth direction in a p-type impurity doped region and a contact portion.

As shown in FIG. 3, an impurity concentration of the contact portion 17 is about $10^{20}$ cm$^{-3}$ near its surface, and an impurity concentration of the neighboring p-type impurity doped region 16 is about $10^{19}$ cm$^{-3}$.

Figure 4:
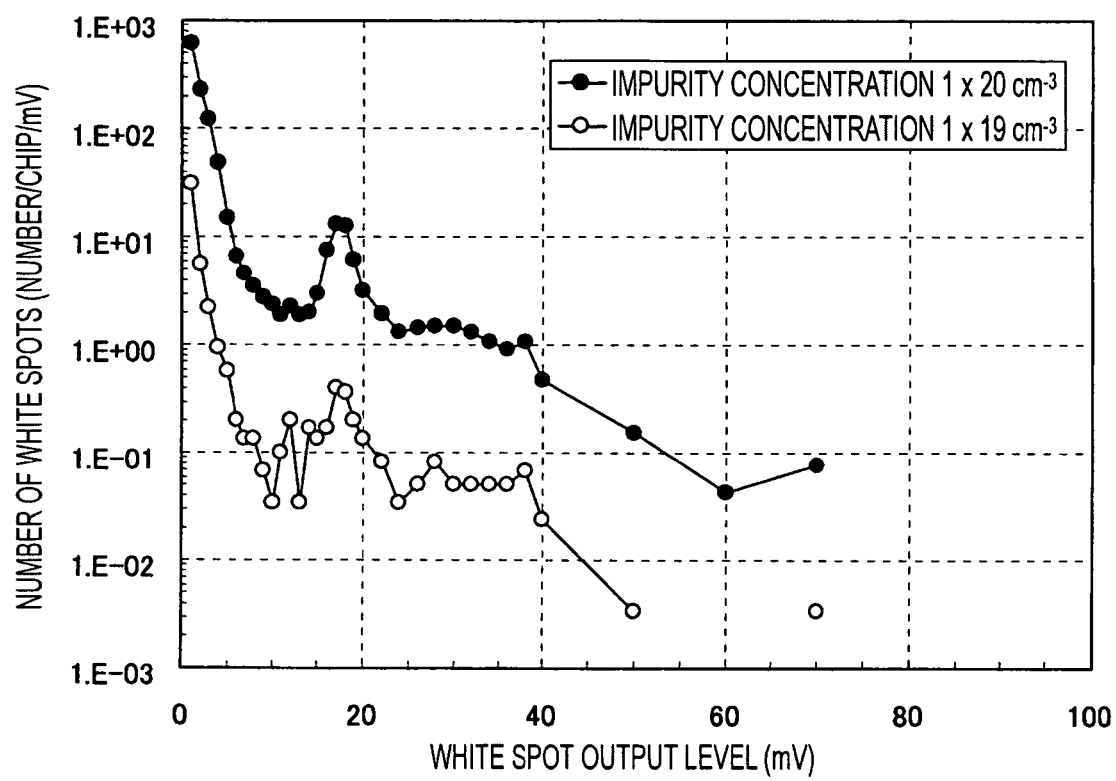
FIG. 4 shows a relationship between the number of white spots and a white spot output level based on a parameter of impurity concentration in the p-type impurity doped region.

FIG. 4 shows a relationship between the impurity concentration and the number of white spots in the p-type impurity doped region 16.

As shown in FIG. 4, the number of white spots when the impurity concentration is about $10^{19}$ cm$^{-3}$ is smaller by approximately an order of magnitude than a case where the impurity concentration is about $10^{20}$ cm$^{-3}$ over an entire white spot output level. Particularly, the number of white spots is smaller by approximately two orders of magnitude near a white spot output level of 3 mV. Possible reasons of this may be a reduction in damages caused by ion implantation, such as a crystal defect, and a reduction in incidental atoms implanted. In order to achieve an ohmic contact, the impurity concentration of the contact portion 17 should not be decreased, and thus the impurity concentration thereof is set to about $10^{20}$ cm$^{-3}$. Therefore, the photoelectric converter 21 is isolated from the contact portion 17 as shown in FIG. 1. Specifically, an n-type impurity forming the photoelectric converter 21 is not introduced into a range of a margin width w=0.1 μm from the contact portion 17. If the photoelectric converter 21 and the contact portion 17 are close to each other, an intense electric field occurs, which causes white spots with a certain probability. In this case, the photoelectric converter 21 as an n-type region is isolated from the contact portion 17 as a high-concentration p-type region. Accordingly, an influence of an intense electric field is small and thus the number of white spots significantly reduces advantageously. Of course, efforts are made to reduce the number of white spots by suppressing crystal defects caused by impurity implantation near the well contact 14 and by preventing mixing/scattering of incidental atoms. Herein, the above-mentioned margin width w is not limited to 0.1 μm. However, it is approximately 0.1 μm under present circumstances, considering a misalignment of a mask and variations in a line width. The margin width w may become narrower by a future improvement in a processing technique. The p-type impurity doped region 16 can be adjacent to the photoelectric converter 21 because the concentration of the p-type impurity doped region 16 is low. It is important that the concentration of the p-type impurity doped region 16 is low unlike in a conventional method.

Next, a case where the photoelectric converter 21 is embedded will be described with reference to FIGS. 5A and 5B. A surface of the embedded photoelectric converter 21 is covered with a p-type layer. By extending the p-type layer to a portion under the well contact, the p-type layer is used as the p-type impurity doped region 16.

Figure 5A:
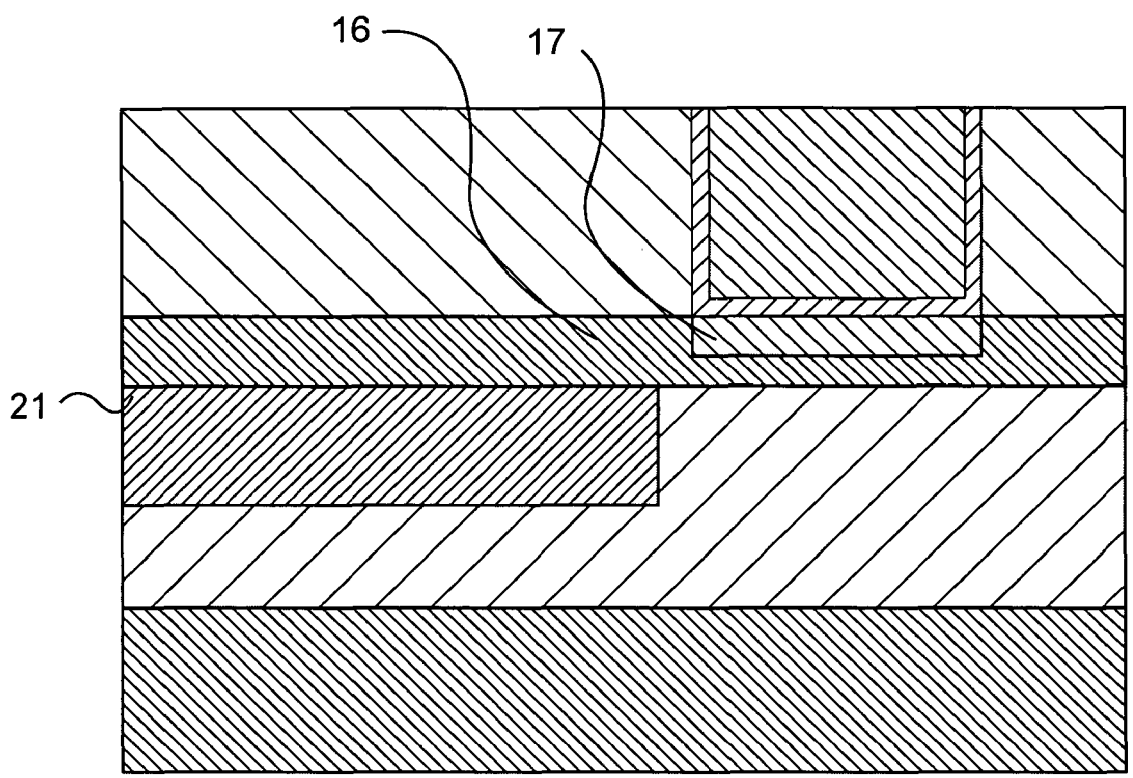
FIGS. 5A and 5B are cross sectional views showing other examples of a schematic configuration of the solid state image pickup device and the method for manufacturing the same according to the first embodiment of the present invention.
Figure 5B:
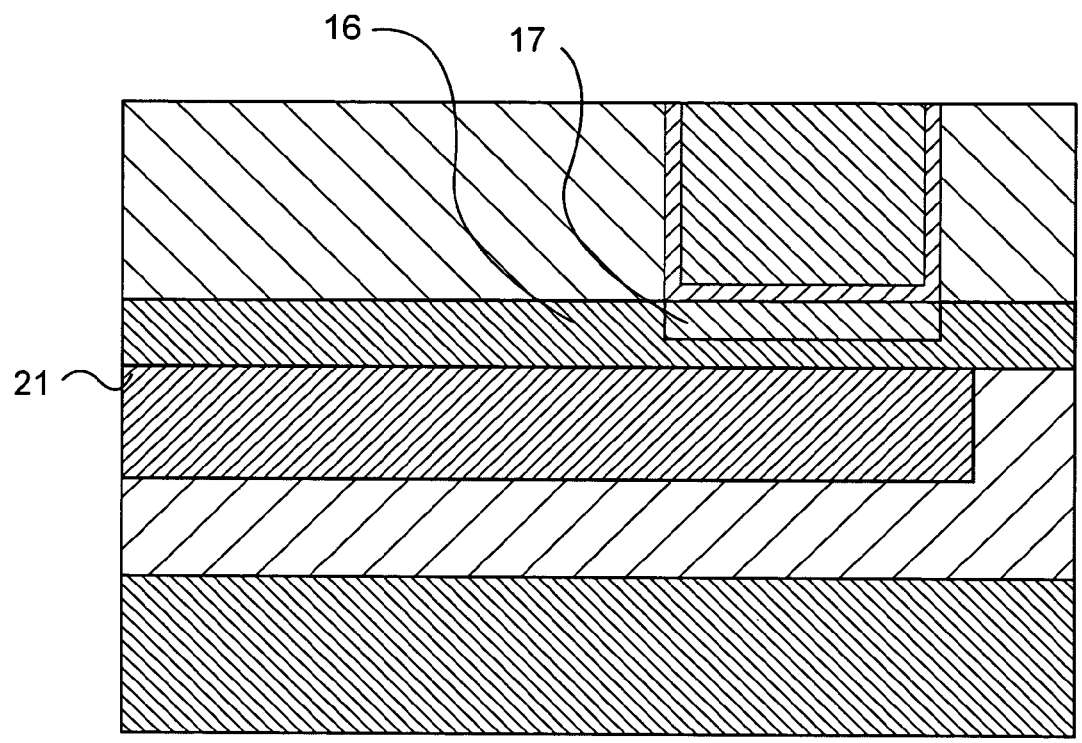

As shown in FIG. 5A, the photoelectric converter 21 serving as an n-type signal charge accumulating region should be desirably isolated from the contact portion 17 for the same reason as described above. However, when the amount of saturation signal is more important than the number of white spots, the photoelectric converter 21 may extend to a portion under the contact portion 17 as shown in FIG. 5B.

The p-type layer on the surface of the embedded photoelectric converter 21 has an impurity concentration of an order of $10^{18}$ cm$^{-3}$ and a vicinity of a surface of the pixel well 12 has an impurity concentration of an order of $10^{17}$ cm$^{-3}$. Thus, the concentration of the p-type impurity doped region 16 is equivalent to a sum of those concentrations, that is, an order of $10^{18}$ cm$^{-3}$.

In a step of forming the p-type impurity doped region 16, the source/drain of the p-type transistor of the peripheral circuit is masked during ion implantation. On the other hand, in a step of forming the contact portion 17, ion implantation can be performed in one step without masking the contact portion of the source/drain of the p-type transistor of the peripheral circuit. In other words, the concentration of the contact portion 17 may be almost the same as that of the contact portion of the source/drain of the p-type transistor obtained in a typical manufacturing process. Of course, a doze for the contact portion 17 may be reduced and an ionic species to be used may be changed by performing individual steps.

Figure 6:
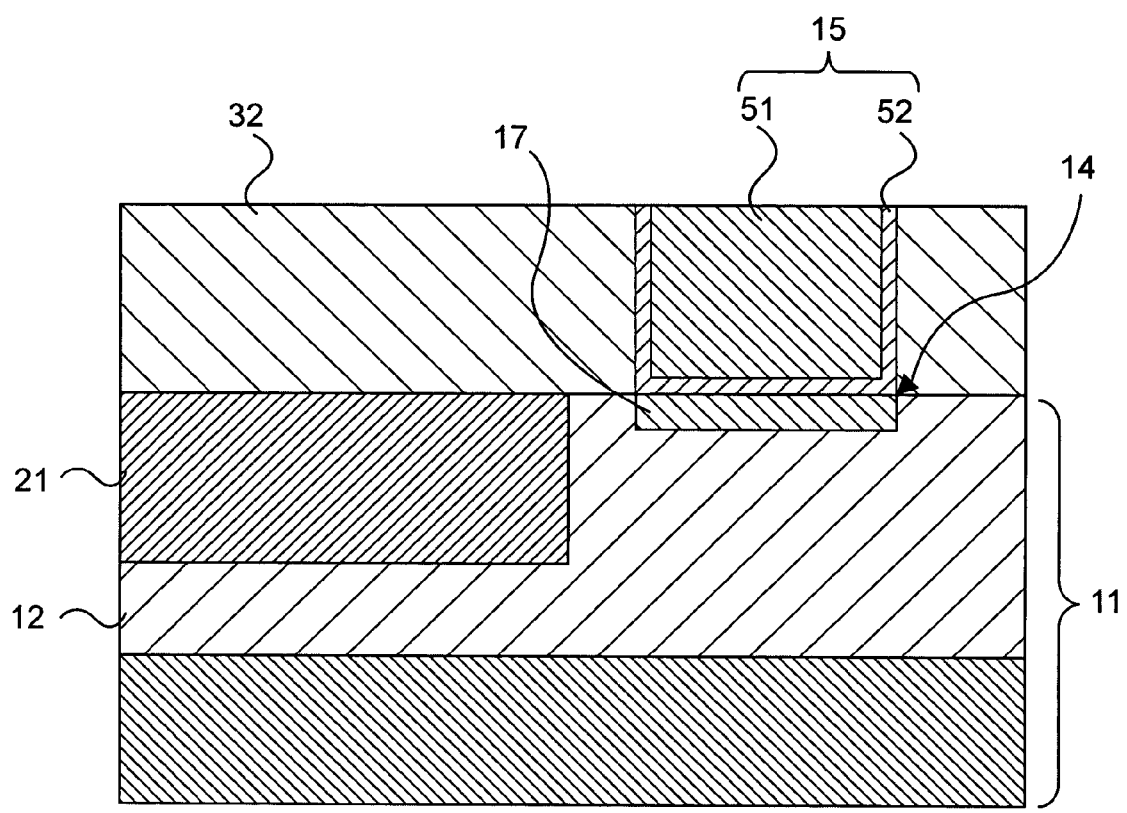
FIG. 6 is a cross sectional view of a schematic configuration showing a solid state image pickup device and a method for manufacturing the same according to a second embodiment of the present invention.

Next, a solid state image pickup device and a method for manufacturing the same according to a second embodiment of the present invention will be described with reference to FIG. 6, which is a cross-sectional view showing a schematic configuration. In FIG. 6, a main portion of one pixel according to the invention is shown.

As shown in FIG. 6, a semiconductor substrate 11 includes a pixel region provided with a plurality of pixels, each pixel including a photoelectric converter 21 and a transfer transistor (not shown); and a pixel well 12 shared by the respective pixels. The photoelectric converter 21 includes a photodiode or the like and the transfer transistor includes an n-channel MOS transistor or the like. The photoelectric converter 21 is an n-type region, is used for conducting photoelectric conversion, and serves as a signal charge accumulating portion.

The pixel well 12 is provided with a well contact 14 supplying a reference voltage for stabilizing a well potential. The well contact 14 includes an electrode 15 placed in an interlayer film 32 and supplying a reference voltage; and a contact portion 17 connecting to the electrode 15 and placed in a surface of the pixel well 12. The solid state image pickup device according to the second embodiment is featured by not having a distinct impurity doped region, that is, the p-type impurity doped region 16 according to the first embodiment, and that an impurity near the surface of the pixel well 12 serves as the p-type impurity doped region 16 in the above-described meaning. The electrode 15 includes a tungsten plug 51 or the like, with a barrier metal layer 52 of a three-layer film: titanium; titanium nitride; and titanium being placed on side surfaces thereof. Further, the electrode 15 connects to a wiring for the well contact (not shown). The contact portion 17 is formed by ion implantation after forming a contact hole for the electrode 15 and before filling the contact hole to form the electrode 15, as in a typical CMOS process. Therefore, the contact portion 17 has a diameter almost the same as that of the electrode 15.

As shown in FIG. 2A, the well contact 14 may be isolated from the photoelectric converter 21. Alternatively, as shown in FIG. 2B, the well contact 14 may be placed in the active region 13 where the photoelectric converter 21 and the transfer transistor 31 are placed. By placing the well contact 14 in the active region 13, the pixel region can be reduced, so that a highly-integrated solid state image pickup device can be obtained. FIG. 6 shows the latter case.

In the solid state image pickup device according to the second embodiment, unlike in the first embodiment, additional ion implantation is not performed on the pixel well 12 to form the p-type impurity doped region 16. Therefore, boron (B) or boron difluoride (BF$_2$) need not be ion-implanted into the pixel well 12 in addition to a step of forming the pixel well 12. Thus, a crystal defect is not likely to be induced in the pixel well 12 and mixing/scattering of heavy-metal atoms can be prevented in the step. As a result, the number of white spots can be reduced. Further, when discriminating the well contact from a well contact in a peripheral circuit, additional ion implantation for forming the p-type impurity doped region 16 need not performed after forming the pixel well. Thus, the number of steps does not increase. In an ion implantation step for the source/drain of the p-type MOS transistor during manufacturing, a portion near the electrode 15 is masked so that ion is not implanted thereto, as in the first embodiment.

In this embodiment, an ohmic contact can be achieved by the contact portion 17 although a contact resistance is slightly higher than that of the solid state image pickup device according to the first embodiment. Since contacts are densely aligned at pixel pitches or several-fold pitches thereof in the pixel region, no problem occurs in a typical product. The configuration of the well contact may be designed in accordance with a pixel in a peripheral circuit other than the pixel region, but in that case, a designing environment for the peripheral circuit must be changed and a characteristic and reliability thereof must be reconsidered. In many cases, pixels are optimized to make the most of their characteristic, but a configuration of a peripheral logic circuit should not be changed. Therefore, the well contact of the peripheral circuit is manufactured by the conventional method so as to discriminate it from the well contact in the pixel region. The other components (the pixel well 12, the photoelectric converter 21, the transfer transistor 31, and so on) are manufactured by a conventional method.

Figure 7:
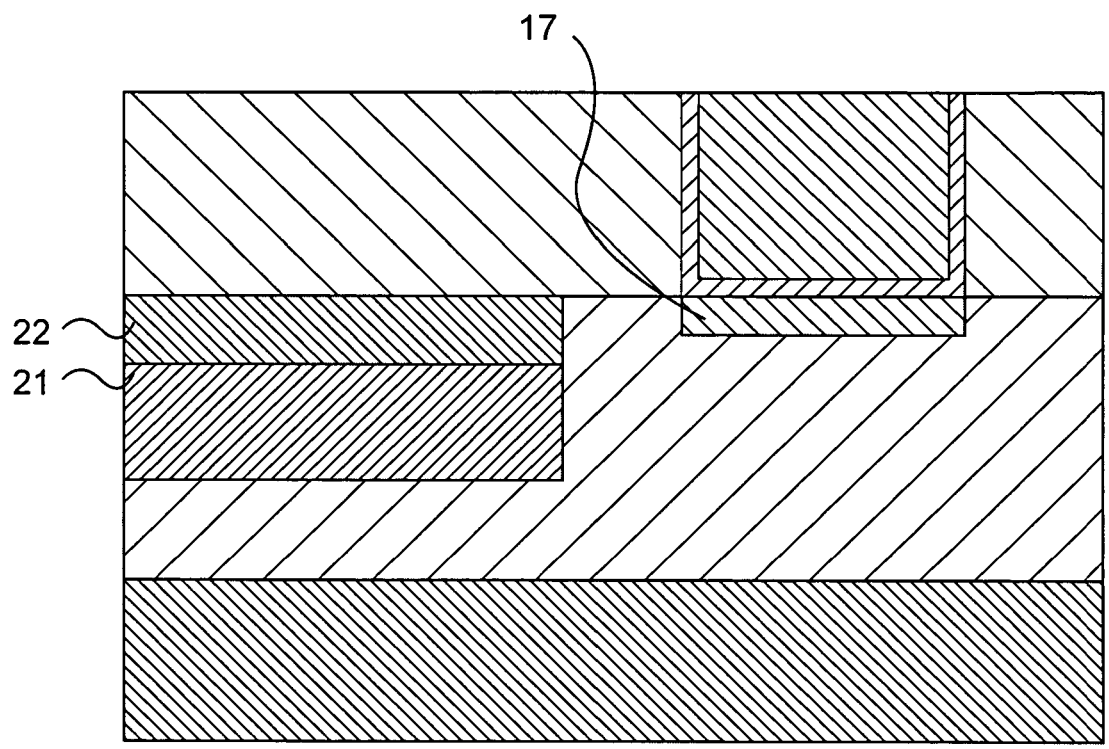
FIG. 7 is a cross sectional view showing another example of a schematic configuration of the solid state image pickup device and the method for manufacturing the same according to the second embodiment of the present invention.

Of course, the photoelectric converter 21 may be embedded as shown in FIG. 7. A p-type layer 22 is placed on a surface of the embedded photoelectric converter 21. The p-type layer 22 may extend to partially overlap the contact portion 17. However, the photoelectric converter 21 is isolated from the contact portion 17 for the same reason as in the first embodiment.

Figure 8:
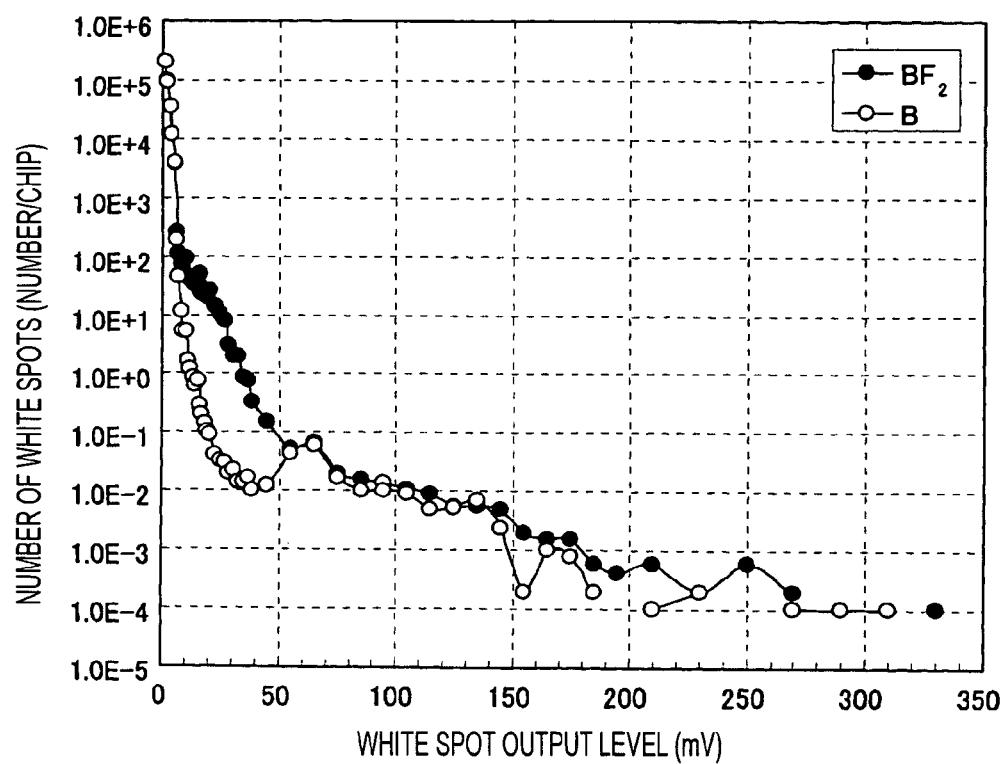
FIG. 8 shows a relationship between the number of white spots and a whit spot output level based on a parameter of a type of impurity.

In the above-described embodiments, when the p-type contact portion 17 in the well contact 14 is formed by ion implantation, boron should be preferably used as an ionic species. By forming the contact portion 17 by ion implantation using boron, the number of white spots can be effectively reduced. FIG. 8 shows a relationship between the number of white spots and a white spot output level in a case where the contact portion 17 is formed by using boron (B) as an ionic species and in a comparative case where the contact portion 17 is formed by using boron difluoride (BF$_2$), which is generally used for forming a shallow p-type layer.

As shown in FIG. 8, in a range of white spot output levels of 5 to 50 mV, the number of white spots was smaller by two orders of magnitude at a maximum in a case where boron (B) is used as an ionic species compared to a case where boron difluoride (BF$_2$) is used as an ionic species. Also, in a high output level of more than 150 mV, the number of white spots was smaller by half to one order of magnitude in a case where boron (B) is used as an ionic species compared to a case where boron difluoride (BF$_2$) is used as an ionic species.

The above-described result can be applied to each of the embodiments of the present invention. In each of the embodiments of the present invention, boron (B) should be used as an ionic species to form the contact portion 17 by ion implantation. By using boron, occurrence of white spots can be dramatically suppressed. A boron compound such as boron difluoride (BF$_2$) has a large ion mass. Therefore, mixing of heavy metals often occurs during ion implantation when boron difluoride (BF$_2$) is used. On the other hand, a mass of any metal atoms is not approximate to that of boron (B), and thus metal atoms are not likely to be mixed and an increase in white spots can be prevented.

In a CMOS process adopted in recent years, boron difluoride ($BF_2$) is used as an ionic species to form a p-type layer on a silicon surface so that a depth of a junction becomes shallow. Also, boron difluoride ($BF_2$) is used in implantation for forming a contact which applies a reference voltage to a p-well. In a typical CMOS process, a source/drain of a p-type transistor is formed by ion implantation by using boron difluoride ($BF_2$) so as to obtain a shallow junction of the source/drain. Also, a contact to be placed therein is formed by ion implantation by using boron difluoride ($BF_2$) so that a junction depth does not become too large. Further, a contact for applying a reference voltage to a p-well is formed by using a step of ion implantation for the source/drain by using boron difluoride ($BF_2$) and contact implantation by using boron difluoride ($BF_2$).

However, it is important to use boron (B) for pixels in order to reduce white spots in a solid state image pickup device. Even when a heavy ion such as a boron compound is implanted to from a p-type contact in a typical CMOS process, at least pixels of a solid state image pickup device must be differently dealt with. Of course, a configuration of a well contact in a peripheral circuit other than the pixel region may be designed in accordance with that of a pixel, but in that case, a designing environment for the peripheral circuit must be changed and a characteristic and reliability thereof must be reconsidered. In many cases, pixels are optimized to make the most of their characteristic, but a configuration of a peripheral logic circuit should not be changed. Therefore, a well contact of the peripheral circuit and a well contact of the pixel region are formed in different implantation steps. That is, ion implantation with boron difluoride ($BF_2$) is performed for the peripheral circuit as in a conventional manner and ion implantation with boron (B) is performed for the pixel region.

Now, an example of a manufacturing method according to these embodiments will be described with reference to FIGS. 9A to 12B. FIGS. 9A to 12B are cross-sectional views showing schematic configurations of a vicinity of the well contact 14 of a pixel, a source/drain portion of a p-type MOS transistor of a peripheral circuit, and a p-well contact portion of the peripheral circuit. Herein, essential steps of the present invention among all steps will be described. In FIGS. 9A to 12B, all components except a contact hole are shown in a form of a cross section, and thus hatching for indicating a cross section is omitted.

As shown in FIG. 9A, a P-well 52 (corresponding to the pixel well 12 shown in FIG. 1), a P-well 54, and an N-well 53 are formed in a silicon substrate 51 by a typical CMOS process.

As shown in FIG. 9B, a photoelectric converter 21 is formed in a surface of the P-well 52 of a pixel well contact portion. Herein, a p-layer 21p and an n-layer 21n are formed as an embedded photodiode by n-type and p-type ion implantation. Of course, only an n-type ion implantation may be performed to form a photoelectric converter of a non-embedded type.

As shown in FIG. 9C, p-type ion implantation is performed to form a $p^+$-layer 61 in a surface of the N-well 53, the $p^+$-layer 61 serving as a source/drain of a p-type MOS transistor. At the same time, ion implantation is performed on a portion to be provided with a contact for applying a reference voltage to the P-well of the peripheral circuit, so as to form a $p^+$-layer 71 in a surface of the P-well 54. A vicinity of the pixel well contact portion is masked with a resist or the like (not shown), so that ion is not implanted thereto. Herein, boron difluoride ($BF_2$) is used as an ionic species in order to form a shallow junction. A dose thereof is set to $1\times10^{15}$ cm$^{-2}$ or more, as in a typical CMOS process. It is important to prevent this high-concentration ion from entering the vicinity of the pixel well contact portion.

Figure 10A:
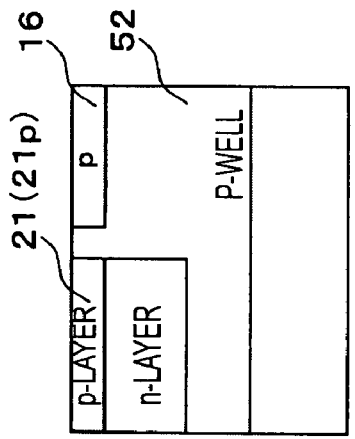
FIGS. 10A and 10B are cross sectional views of schematic configurations showing the method for manufacturing the solid state image pickup device according to the embodiment of the present invention.
Figure 10A:
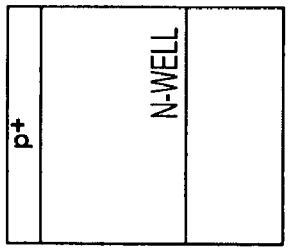
Figure 10A:
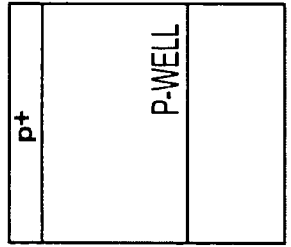

As shown in FIG. 10A, a p-type impurity doped region 16 is formed in the P-well 52 of the pixel by ion implantation by using boron difluoride ($BF_2$), which is a boron/fluorine compound. A doze in the ion implantation is set to $1\times10^{14}$ cm$^{-2}$ or less. The ion species may also be boron (B). As described above, this ion implantation can be realized by the ion implantation for forming the p-layer 21p of the photoelectric converter 21 in FIG. 9B. Further, this ion implantation can be omitted depending on a required characteristic. The p-type impurity doped region 16 is formed by ion implantation which is performed before forming an interlayer film.

Figure 10B:
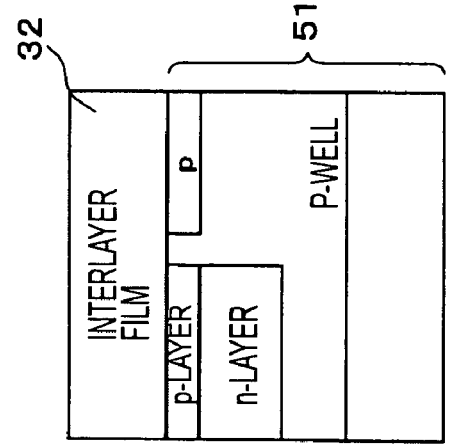
Figure 10B:
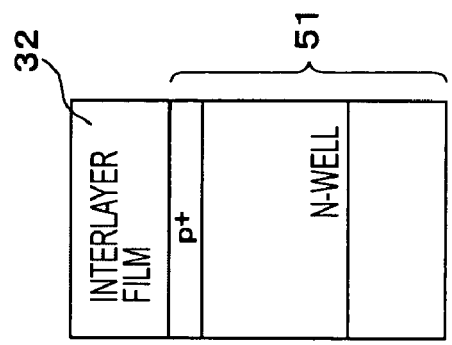
Figure 10B:
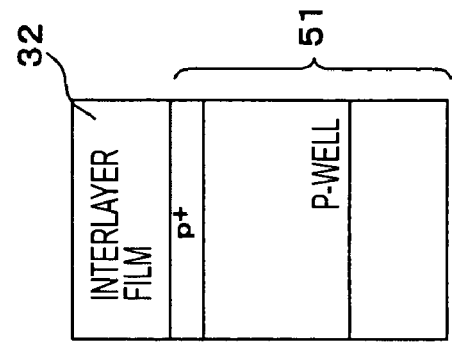

As shown in FIG. 10B, an interlayer film 32 is formed on the silicon substrate 51 by a typical CMOS process.

As shown in FIG. 11A, contact holes 33, 34, and 35 are formed in the interlayer film 32 by a typical CMOS process.

As shown in FIG. 11B, boron difluoride ($BF_2$) of a dose of $1\times10^{15}$ cm$^{-2}$ or more is ion-implanted to the PMOS portion and the peripheral circuit through the contact holes 34 and 35 by a typical CMOS process, so as to form $p^+$-layers 62 and 72. At this time, the pixel portion is masked (not shown) to prevent the boron difluoride ($BF_2$) from entering.

Figure 12A:
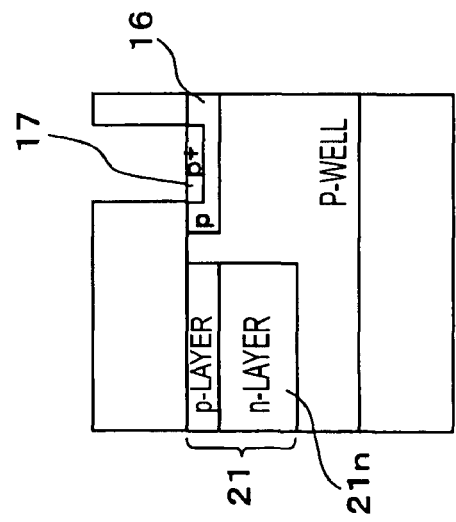
FIGS. 12A and 12B are cross sectional views of schematic configurations showing the method for manufacturing the solid state image pickup device according to the embodiment of the present invention.
Figure 12A:
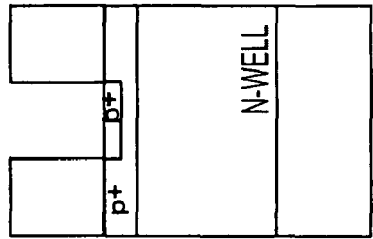
Figure 12A:
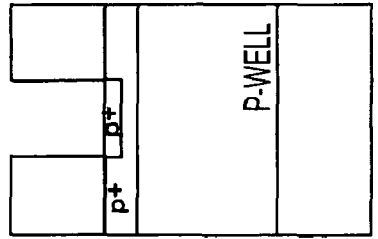

As shown in FIG. 12A, boron (B) of a dose of about $1\times10^{15}$ cm$^{-2}$ is ion-implanted to the pixel portion through the contact hole, so as to form a contact portion 17 in the p-type impurity doped region 16. The contact portion 17 has almost the same diameter as that of the contact hole. As shown in the figure, the contact portion 17 is isolated from the n-layer 21n of the photoelectric converter 21.

Figure 12B:
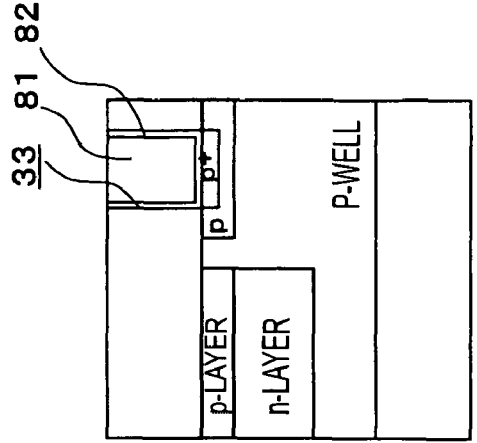
Figure 12B:
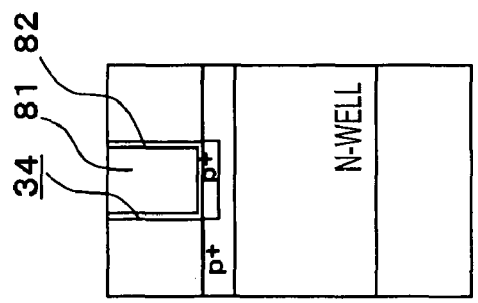
Figure 12B:
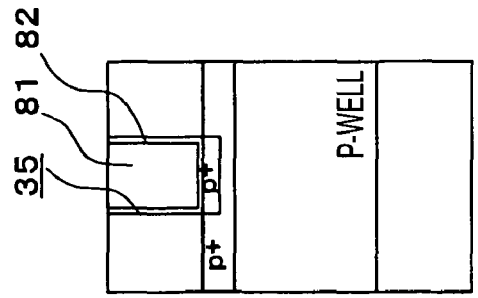
Figure 13:
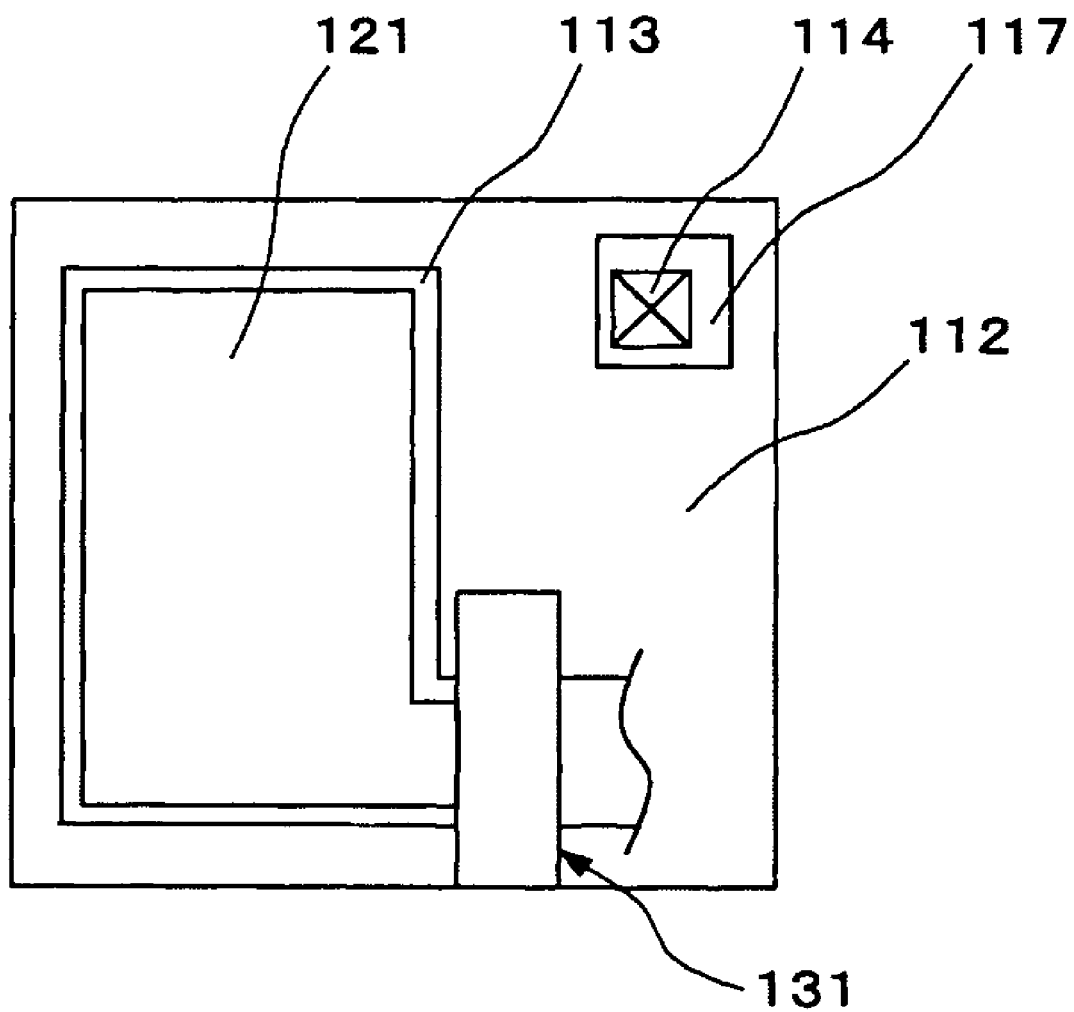
FIG. 13 is a plane layout view showing a position of a well contact in a known pixel.

As shown in FIG. 12B, each of the contact holes 33, 34, and 35 is filled with a conductive material 81 via a barrier metal layer 82 by a typical CMOS process. By using the above-described manufacturing method or another manufacturing method easily modified by those skilled in the art, the solid state image pickup device according to the above-described embodiments can be manufactured.

The present invention has been described above. The present invention can be applied to various modifications without deviating from the scope of the present invention. For example, instead of sharing a well by all pixels, some wells may be provided. Further, instead of providing a photoelectric converter in a semiconductor substrate, an independent photoelectric conversion film may be laminated on the semiconductor substrate. With this configuration, the same effects can be obtained because a portion for accumulating a signal charge is placed in the semiconductor substrate. The present invention can be applied to any configuration based on the same discussion as long as many pixels for accumulating a signal charge to be read by a transistor are arranged two-dimensionally, even if the signal is not optical.

As described above, the solid state image pickup device of the present invention has the following advantages. That is, since the impurity concentration of the first impurity doped region is lower than that of the source/drain of the MIS transistor, crystal defects caused in the substrate reduce. Therefore, a dark current is less likely to occur and the number of white spots significantly reduces. Further, in the solid state image pickup device of the present invention, the first impurity doped region is doped with at least an impurity of the first conductive type, with the impurity concentration being set to $1\times10^{19}$ cm$^{-3}$ or less. Accordingly, crystal defects caused in the substrate reduce, a dark current is less likely to occur, and thus the number of white spots significantly reduces. Still further, since the signal charge accumulating portion is isolated from the contact portion, an influence of an intense electric field between the signal charge accumulating portion and the contact portion is small. Accordingly, the number of white spots significantly reduces.

As described above, the method for manufacturing a solid state image pickup device of the present invention has the following advantages. That is, since the first impurity doped region is formed by introducing an impurity of the first conductive type, with the impurity concentration being $1\times10^{19}$ cm$^{-3}$ or less in total, crystal defects caused in the substrate can be reduced and mixing of an undesired impurity can be reduced. Accordingly, occurrence of a dark current due to crystal defects and mixing of heavy metals can be suppressed, and as a result, the number of white spots can be significantly reduced. This advantage can be realized by performing ion implantation for forming the source/drain of the MIS transistor of the first conductive type in the peripheral circuit, while masking the first impurity doped region. Further, by using boron in ion implantation through the hole of the contact portion after forming the interlayer film, the number of white spots can be significantly reduced.

The solid state image pickup device and the method for manufacturing the same of the present invention are preferably applied to solid state image pickup devices for picking up images, such as a CMOS sensor, a camera module device including a signal processing portion and the other various image pickup devices.

What is claimed is:

1. A solid state image pickup device comprising a semiconductor substrate including (a) a pixel region where a plurality of pixels are arranged, each pixel including a signal charge accumulating portion and one or more transistors, and (b) a peripheral circuit region outside the pixel region,
wherein the pixel region includes:
a pixel well of a first conductive type in the substrate;
at least one charge accumulating portion extending in the pixel well;
a first impurity doped region of a first conductive type in a surface of the pixel well; and
a pixel well contact of the first conductive type in a surface of the first impurity doped region; and
wherein:
the pixel well contact has a higher doping concentration than the first impurity doped region,
the at least one signal charge accumulating portion is of a second conductive type, and
the at least one charge accumulating portion extends to a point where the pixel well contact overlies the charge accumulating portion.

2. The solid state image pickup device according to claim 1, wherein the first impurity doped region is doped with at least an impurity of the first conductive type and the impurity concentration thereof is $1\times10^{19}$ cm$^{-3}$ or less.

3. The solid state image pickup device according to claim 1, wherein the first conductive type is a p-type and the second conductive type is an n-type.

4. The solid state image pickup device according to claim 1, wherein the at least one signal charge accumulating portion is isolated from a contact portion.

5. The solid state image pickup device according to claim 1, wherein:
the at least one signal charge accumulating portion includes a surface region of the first conductive type and an accumulating region of the second conductive type disposed under the surface region; and
the surface region is part of the first impurity doped region.

6. The solid state image pickup device according to claim 5, wherein the at least one signal charge accumulating portion extends completely under the contact portion.

7. The solid state image pickup device according to claim 1, wherein:
the peripheral circuit region includes a second peripheral well of the first conductive type;
at least one of peripheral contacts via which a reference voltage can be supplied to the second peripheral well comprises, (a) a peripheral electrode via which a reference voltage can be supplied, (b) a second impurity doped region of the first conductive type in a surface of the second peripheral well, and (c) a contact portion of the first conductive type in the second impurity doped region so as to be connected to the peripheral electrode; and
an impurity concentration of the second impurity doped region is higher than that of the first impurity doped region.

8. A solid state image pickup device comprising a semiconductor substrate including (a) a pixel region where a plurality of pixels are arranged, each pixel including a signal charge accumulating portion and one or more transistors, and (b) a pixel well in the substrate of a first conductive type shared by the respective pixels,
wherein:
the pixel region is provided with a pixel well contact via which a reference voltage can be supplied to the pixel well,
the pixel well contact comprises (i) an electrode over the pixel well supplying a reference voltage, (ii) a first impurity doped region of the first conductive type placed in a surface of the pixel well, and (iii) a contact portion of the first conductive type placed in a surface of the first impurity doped region so as to be connected to the electrode, the contact portion having a higher doping concentration than that of the first impurity doped region;
the first impurity doped region is doped with at least an impurity of the first conductive type and the impurity concentration thereof is $1\times10^{19}$ cm$^{-3}$ or less; and
the at least one signal charge accumulating portion extends to a point under the pixel well contact where the pixel well contact overlies the signal charge accumulating portion; and
the at least one signal charge accumulating portion is of a second conductive type opposite the first conductive type.

9. The solid state image pickup device according to claim 8, wherein the first conductive type is a p-type.

10. The solid state image pickup device according to claim 8, wherein the at least one signal charge accumulating portion is isolated from a contact portion.

11. The solid state image pickup device according to claim 8, wherein:
the at least one signal charge accumulating portion includes a surface region of the first conductive type and an accumulating region of the second conductive type disposed under the surface region, and
part of the surface region is part of the first impurity doped region.

12. The solid state image pickup device according to claim 11, wherein the at least one signal charge accumulating portion extends completely under the contact portion.

* * * * *